United States Patent
Chuang et al.

(10) Patent No.: US 10,943,760 B2
(45) Date of Patent: Mar. 9, 2021

(54) ELECTRON GUN AND ELECTRON MICROSCOPE

(71) Applicants: KLA Corporation, Milpitas, CA (US); National Institute of Advanced Industrial Science and Technology, Tokyo (JP)

(72) Inventors: Yung-Ho Alex Chuang, Cupertino, CA (US); Yinying Xiao-Li, San Jose, CA (US); Edgardo Garcia Berrios, San Jose, CA (US); John Fielden, Los Altos, CA (US); Masayoshi Nagao, Ibaraki (JP)

(73) Assignees: KLA Corporation, Milpitas, CA (US); National Institute Of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 16/568,110

(22) Filed: Sep. 11, 2019

(65) Prior Publication Data

US 2020/0118783 A1 Apr. 16, 2020

Related U.S. Application Data

(60) Provisional application No. 62/744,890, filed on Oct. 12, 2018, provisional application No. 62/885,624, filed on Aug. 12, 2019.

(51) Int. Cl.
*H01J 37/073* (2006.01)
*H01J 37/28* (2006.01)
*H01J 37/317* (2006.01)

(52) U.S. Cl.
CPC .............. *H01J 37/073* (2013.01); *H01J 37/28* (2013.01); *H01J 37/3174* (2013.01)

(58) Field of Classification Search
CPC ...... H01J 37/073; H01J 37/3174; H01J 37/28; H01J 2237/06341; H01J 2237/0635
(Continued)

(56) References Cited

U.S. PATENT DOCUMENTS 3,755,704 A 8/1973 Spindt et al.
3,870,917 A 3/1975 Cuny
(Continued)

FOREIGN PATENT DOCUMENTS

EP 0602983 A1 6/1994
EP 0746871 A1 12/1996
(Continued)

OTHER PUBLICATIONS

Tobin, Kenneth W., Inspection in Semiconductor Manufacturing, Webster's Encyclopedia of Electrical and Electronic Engineering, vol. 10, pp. 242-262, Wiley & Sons, NY, NY, 1999.
(Continued)

*Primary Examiner* — David A Vanore
(74) *Attorney, Agent, or Firm* — Bever, Hoffman & Harms, LLP (57) ABSTRACT

An electron gun for an electron microscope or similar device includes a field emitter cathode having a field emitter protrusion extending from the output surface of a monocrystalline silicon substrate, and electrodes configured to enhance the emission of electrons from a tip portion of the field emitter protrusion to generate a primary electron beam. A thin, contiguous SiC layer is disposed directly on at least the tip portion of the field emitter protrusion using a process that minimizes oxidation and defects in the SiC layer. Optional gate layers may be placed at, slightly lower than or slightly higher than the height of the field emitter tip portion to achieve high emission current and fast and accurate control of the primary emission beam. The field emitter can (Continued)

be p-type doped and configured to operate in a reverse bias mode, or the field emitter can be n-type doped.

18 Claims, 6 Drawing Sheets

(58) Field of Classification Search
USPC .......................................... 250/492.1, 492.2
See application file for complete search history.

(56) References Cited

U.S. PATENT DOCUMENTS

| | | | |
|---|---|---|---|
| 3,947,707 A | 3/1976 | Shannon et al. | |
| 4,099,198 A | 7/1978 | Howorth et al. | |
| 4,210,922 A | 7/1980 | Shannon | |
| 4,275,326 A | 6/1981 | Houtkamp | |
| 4,348,690 A | 9/1982 | Jastrzebski et al. | |
| 4,467,189 A | 8/1984 | Tsuchiya | |
| 4,555,731 A | 11/1985 | Zinchuk | |
| 4,760,031 A | 7/1988 | Janesick | |
| 5,054,683 A | 10/1991 | Haisma et al. | |
| 5,120,949 A | 6/1992 | Tomasetti | |
| 5,144,630 A | 9/1992 | Lin | |
| 5,199,917 A | 4/1993 | MacDonald et al. | |
| 5,227,313 A | 7/1993 | Gluck et al. | |
| 5,315,126 A | 5/1994 | Field | |
| 5,363,021 A | 11/1994 | MacDonald | |
| 5,372,973 A | 12/1994 | Doan et al. | |
| 5,376,810 A | 12/1994 | Hoenk et al. | |
| 5,382,867 A | 1/1995 | Yuji et al. | |
| 5,402,749 A | 4/1995 | Sexton et al. | |
| 5,554,859 A | 9/1996 | Tsukamoto et al. | |
| 5,559,389 A * | 9/1996 | Spindt | B82Y 10/00 313/310 |
| 5,563,702 A | 10/1996 | Emery et al. | |
| 5,717,518 A | 2/1998 | Shafer et al. | |
| 5,719,069 A | 2/1998 | Sparks | |
| 5,731,584 A | 3/1998 | Beyne et al. | |
| 5,742,626 A | 4/1998 | Mead et al. | |
| 5,760,899 A | 6/1998 | Eismann | |
| 5,828,163 A * | 10/1998 | Jones | H01J 1/3042 313/336 |
| 5,852,322 A | 12/1998 | Speckbacher | |
| 5,940,685 A | 8/1999 | Loomis et al. | |
| 5,965,898 A * | 10/1999 | Jones | H01J 3/022 257/10 |
| 5,990,604 A * | 11/1999 | Geis | H01J 1/3042 257/10 |
| 5,999,310 A | 12/1999 | Shafer et al. | |
| 6,013,399 A | 1/2000 | Nguyen | |
| 6,031,250 A * | 2/2000 | Brandes | H01J 1/3042 257/77 |
| 6,162,707 A | 12/2000 | Dinh et al. | |
| 6,193,870 B1 * | 2/2001 | Morse | H01J 9/025 205/123 |
| 6,201,257 B1 | 3/2001 | Stettner et al. | |
| 6,201,601 B1 | 3/2001 | Vaez-Iravani et al. | |
| 6,220,914 B1 | 4/2001 | Lee et al. | |
| 6,255,771 B1 * | 7/2001 | Jones | H01J 3/022 313/306 |
| 6,271,916 B1 | 8/2001 | Marxer et al. | |
| 6,278,119 B1 | 8/2001 | Nikzad et al. | |
| 6,285,018 B1 | 9/2001 | Aebi et al. | |
| 6,297,879 B1 | 10/2001 | Yang et al. | |
| 6,307,586 B1 | 10/2001 | Costello | |
| 6,346,700 B1 | 2/2002 | Cunningham et al. | |
| 6,353,286 B1 * | 3/2002 | Talin | H01J 29/085 313/306 |
| 6,362,484 B1 | 3/2002 | Beyne et al. | |
| 6,373,869 B1 | 4/2002 | Jacob | |
| 6,403,963 B1 | 6/2002 | Nikzad et al. | |
| 6,517,405 B1 | 2/2003 | Cheng et al. | |
| 6,535,531 B1 | 3/2003 | Smith et al. | |
| 6,545,281 B1 | 4/2003 | McGregor et al. | |
| 6,608,676 B1 | 8/2003 | Zhao et al. | |
| 6,711,283 B1 | 3/2004 | Soenksen | |
| 6,828,565 B2 | 12/2004 | Steigerwald | |
| 6,837,766 B2 | 1/2005 | Costello | |
| 7,005,637 B2 | 2/2006 | Costello et al. | |
| 7,039,157 B2 | 5/2006 | Fujii et al. | |
| 7,126,699 B1 | 10/2006 | Wihl et al. | |
| 7,130,039 B2 | 10/2006 | Vaez-Iravani et al. | |
| 7,154,091 B2 | 12/2006 | Zewail et al. | |
| 7,283,166 B1 | 10/2007 | Billman | |
| 7,313,155 B1 | 12/2007 | Mu et al. | |
| 7,321,468 B2 | 1/2008 | Herkommer et al. | |
| 7,345,825 B2 | 3/2008 | Chuang et al. | |
| 7,352,457 B2 | 4/2008 | Kvamme et al. | |
| 7,432,517 B2 | 10/2008 | Botma et al. | |
| 7,446,474 B2 | 11/2008 | Maldonado et al. | |
| 7,465,935 B2 | 12/2008 | Urano et al. | |
| 7,525,649 B1 | 4/2009 | Leong et al. | |
| 7,528,943 B2 | 5/2009 | Brown et al. | |
| 7,586,108 B2 | 9/2009 | Nihtianov et al. | |
| 7,609,309 B2 | 10/2009 | Brown et al. | |
| 7,741,666 B2 | 6/2010 | Nozaki et al. | |
| 7,750,280 B2 | 7/2010 | Hwang et al. | |
| 7,791,170 B2 | 9/2010 | Chiang et al. | |
| 7,800,040 B2 | 9/2010 | Blacksberg et al. | |
| 7,813,406 B1 | 10/2010 | Nguyen et al. | |
| 7,875,948 B2 | 1/2011 | Hynecek et al. | |
| 7,884,373 B2 * | 2/2011 | Korenstein | H01L 21/02389 257/615 |
| 7,902,736 B2 | 3/2011 | Hudspeth et al. | |
| 7,928,382 B2 | 4/2011 | Hatakeyama et al. | |
| 7,952,633 B2 | 5/2011 | Brown et al. | |
| 7,985,658 B2 | 7/2011 | Lei et al. | |
| 7,999,342 B2 | 8/2011 | Hsu et al. | |
| 8,017,427 B2 | 9/2011 | Manabe | |
| 8,138,485 B2 | 3/2012 | Nihtianov et al. | |
| 8,309,443 B2 | 11/2012 | Tanaka et al. | |
| 8,323,406 B2 | 12/2012 | Bondokov et al. | |
| 8,450,820 B2 | 5/2013 | Nanver et al. | |
| 8,455,971 B2 | 6/2013 | Chen et al. | |
| 8,513,587 B2 | 8/2013 | Wang et al. | |
| 8,629,384 B1 | 1/2014 | Biellak et al. | |
| 8,665,536 B2 | 3/2014 | Armstrong | |
| 8,755,417 B1 | 6/2014 | Dribinski | |
| 8,873,596 B2 | 10/2014 | Dribinski et al. | |
| 8,891,079 B2 | 11/2014 | Zhao et al. | |
| 8,896,917 B2 | 11/2014 | Armstrong | |
| 8,929,406 B2 | 1/2015 | Chuang et al. | |
| 8,976,343 B2 | 3/2015 | Genis | |
| 9,055,246 B2 | 6/2015 | Tay | |
| 9,426,400 B2 | 8/2016 | Brown et al. | |
| 9,478,402 B2 | 10/2016 | Chuang et al. | |
| 9,496,425 B2 | 11/2016 | Chern et al. | |
| 9,529,182 B2 | 12/2016 | Chuang et al. | |
| 9,601,299 B2 | 3/2017 | Chuang et al. | |
| 9,608,399 B2 | 3/2017 | Chuang et al. | |
| 9,748,294 B2 | 8/2017 | Muramatsu et al. | |
| 9,804,101 B2 | 10/2017 | Deng et al. | |
| 9,966,230 B1 | 5/2018 | Chuang et al. | |
| 10,133,181 B2 | 11/2018 | Chuang et al. | |
| 10,197,501 B2 | 2/2019 | Chuang et al. | |
| 2001/0017344 A1 | 8/2001 | Aebi | |
| 2002/0191834 A1 | 12/2002 | Fishbaine | |
| 2003/0222579 A1 | 12/2003 | Habib et al. | |
| 2004/0021061 A1 | 2/2004 | Bijkerk | |
| 2004/0056279 A1 | 3/2004 | Niigaki et al. | |
| 2004/0126929 A1 | 7/2004 | Tang et al. | |
| 2004/0227070 A1 | 11/2004 | Bateman et al. | |
| 2004/0251428 A1 | 12/2004 | Nishimura et al. | |
| 2005/0167575 A1 | 8/2005 | Benz et al. | |
| 2005/0264148 A1 | 12/2005 | Maldonado et al. | |
| 2006/0001360 A1 | 1/2006 | Tatsumi et al. | |
| 2006/0054778 A1 | 3/2006 | Suhling | |
| 2006/0054879 A1 | 3/2006 | Jin | |
| 2006/0055321 A1 | 3/2006 | Maldonado et al. | |
| 2006/0069460 A1 | 3/2006 | Smith et al. | |
| 2006/0098782 A1 | 5/2006 | Dunham et al. | |
| 2006/0170324 A1 | 8/2006 | Machuca et al. | |
| 2007/0002465 A1 | 1/2007 | Chuang et al. | |

(56) References Cited

U.S. PATENT DOCUMENTS

| | | | |
|---|---|---|---|
| 2007/0034987 A1 | 2/2007 | Costello et al. | |
| 2007/0096623 A1* | 5/2007 | Kato | H01J 31/127 313/496 |
| 2007/0103769 A1 | 5/2007 | Kuwabara | |
| 2007/0171152 A1* | 7/2007 | Iguchi | G09G 3/22 345/75.2 |
| 2007/0291810 A1 | 12/2007 | Luo et al. | |
| 2008/0044932 A1 | 2/2008 | Samoilov et al. | |
| 2008/0173903 A1 | 7/2008 | Imai et al. | |
| 2008/0267241 A1 | 10/2008 | Brown et al. | |
| 2008/0315092 A1 | 12/2008 | Kley | |
| 2008/0315121 A1 | 12/2008 | Nihtianov et al. | |
| 2009/0021717 A1 | 1/2009 | Nihtianov et al. | |
| 2009/0091752 A1 | 4/2009 | Terasawa et al. | |
| 2009/0125242 A1 | 5/2009 | Choi et al. | |
| 2009/0128912 A1 | 5/2009 | Okada et al. | |
| 2009/0168152 A1 | 7/2009 | Gelernt et al. | |
| 2009/0180176 A1 | 7/2009 | Armstrong et al. | |
| 2010/0102213 A1 | 4/2010 | Garris | |
| 2010/0123382 A1* | 5/2010 | Li | H01J 9/025 313/346 R |
| 2010/0148667 A1 | 6/2010 | Niigaki et al. | |
| 2010/0188655 A1 | 7/2010 | Brown et al. | |
| 2010/0194956 A1 | 8/2010 | Yuan et al. | |
| 2010/0301437 A1 | 12/2010 | Brown et al. | |
| 2011/0073982 A1 | 3/2011 | Armstrong et al. | |
| 2011/0101219 A1 | 5/2011 | Uchiyama et al. | |
| 2011/0116077 A1 | 5/2011 | Chuang et al. | |
| 2011/0169116 A1 | 7/2011 | Nanver et al. | |
| 2011/0234790 A1 | 9/2011 | True | |
| 2011/0256655 A1 | 10/2011 | Nikzad et al. | |
| 2011/0261354 A1 | 10/2011 | Sinfield et al. | |
| 2011/0291109 A1 | 12/2011 | Wraback et al. | |
| 2012/0012811 A1 | 1/2012 | Deflumere et al. | |
| 2012/0012957 A1 | 1/2012 | Larsen et al. | |
| 2012/0038809 A1 | 2/2012 | Lee et al. | |
| 2012/0081684 A1 | 4/2012 | Den Oef et al. | |
| 2012/0132823 A1 | 5/2012 | Menge et al. | |
| 2012/0160993 A1 | 6/2012 | Nevet et al. | |
| 2012/0170021 A1 | 7/2012 | Walsh | |
| 2012/0228485 A1 | 9/2012 | Iwakiri et al. | |
| 2012/0268722 A1 | 10/2012 | Nihtianov et al. | |
| 2013/0015324 A1 | 1/2013 | Park et al. | |
| 2013/0016346 A1 | 1/2013 | Romanovsky et al. | |
| 2013/0017205 A1 | 1/2013 | Giaccia et al. | |
| 2013/0056843 A1 | 3/2013 | Lee et al. | |
| 2013/0077086 A1 | 3/2013 | Chuang et al. | |
| 2013/0082241 A1 | 4/2013 | Kub et al. | |
| 2013/0088706 A1 | 4/2013 | Chuang et al. | |
| 2013/0176552 A1 | 7/2013 | Brown et al. | |
| 2013/0194445 A1 | 8/2013 | Brown et al. | |
| 2013/0270663 A1 | 10/2013 | Lin et al. | |
| 2013/0313440 A1 | 11/2013 | Chuang et al. | |
| 2013/0320211 A1 | 12/2013 | Park et al. | |
| 2014/0111799 A1 | 4/2014 | Lei et al. | |
| 2014/0203386 A1 | 7/2014 | Bui et al. | |
| 2014/0204963 A1 | 7/2014 | Chuang et al. | |
| 2014/0246595 A1 | 9/2014 | Menge et al. | |
| 2014/0305367 A1 | 10/2014 | Chuang et al. | |
| 2014/0362203 A1 | 12/2014 | Delaney et al. | |
| 2015/0007765 A1 | 1/2015 | Dribinski | |
| 2015/0177159 A1 | 6/2015 | Brown et al. | |
| 2015/0275393 A1 | 10/2015 | Bondokov et al. | |
| 2015/0294998 A1 | 10/2015 | Nihtianov et al. | |
| 2017/0047207 A1* | 2/2017 | Chuang | H01J 37/073 |
| 2019/0134604 A1* | 5/2019 | Walsh | B01J 20/28016 |

FOREIGN PATENT DOCUMENTS

| | | |
|---|---|---|
| EP | 1939917 A2 | 7/2008 |
| EP | 2346094 A1 | 7/2011 |
| JP | H0511287 A | 1/1993 |
| JP | H08241977 A | 9/1996 |
| JP | H10171965 A | 6/1998 |
| JP | 2002033473 | 1/2002 |
| JP | 2003043533 A | 2/2003 |
| JP | 2004031452 A | 1/2004 |
| JP | 2007040909 A | 2/2007 |
| JP | 2007086108 A | 4/2007 |
| JP | 2007249092 A | 9/2007 |
| JP | 2007298932 A | 11/2007 |
| JP | 2009117454 A | 5/2009 |
| JP | 2015201412 A | 11/2015 |
| KR | 100688497 B1 | 3/2007 |
| KR | 100826407 B1 | 5/2008 |
| RU | 2297070 C2 | 4/2007 |
| WO | 9532518 A1 | 11/1995 |
| WO | 9617372 A1 | 6/1996 |
| WO | 2007035858 A2 | 3/2007 |
| WO | 2008121232 A1 | 10/2008 |
| WO | 2011091159 A1 | 7/2011 |
| WO | 2013006867 A1 | 1/2013 |
| WO | 2014067754 A2 | 5/2014 |

OTHER PUBLICATIONS

T.R. Groves et al., "Maskless electron beam lithography: prospected, progress, and challenges", Microelectronic Engineering, Jul. 2002, vol. 61, No. 1, 285-293.

Utsumi, Takao, Vacuum Microelectrnoics: What's New and Exciting, IEEE vol. 38, No. 10, Oct. 1991, 8 pgs.

Xiaogian, Fu, Higher Quantum Efficiency by Optimizing . . . 978-1-4244-6644-3/10 IEEE, pp. 234-235.

U.S. Appl. No. 61/720,700—Certified Copy corres to PCT/EP2013/071080, pp. 1-44.

Allen et al., Work Function, Photoelectric Threshold, and Surface . . . ; Physical Review, vol. 127, No. 1, Jul. 1, 1962, pp. 150-158.

Armstrong, Carter M.The Quest for the Ultimate Vacuum Tube, Spectrum IEEE, Dec. 2015, 4 pgs.

C.A. Spindt., "A Thin-Film Field-Emission Cathode", Journal of Applied Physics, The American Institute of Physics, Jun. 1968, vol. 39, No. 7, 3 pages.

Ding, MengField Emission from Silicon, MIT 2001, 277 pgs.

Dulinski et al., Tests of a backside illuminated monolithic CMOS pixel . . . , Nuclear Instruments and Methods in Physics Research A 546 (2005) 274-280, 7 pgs.

Fanton et al, Multiparameter Measurements of Thin Film . . . , Journal of Applied Physics, vol. 73, No. 11, p. 7035 (1993).

Field Emitter Review, 7 pgs in Japanese.

Fowler, R. H., et al, Electron Emission in Intense Electric Fields, Mar. 31, 1928, 9 pgs.

Freed; Regina et al., "Reflective electron-beam lithography performance for the 10nm logic node", Proceedings of SPIE, SPIE, Nov. 8, 2012, vol. 8522, 10 pages.

Fu et al., Optimizing GaN photocathode structure for higher . . . ; Optik, vol. 123, No. 9, May 2012, pp. 756-768.

Grubisic et al., New Silicon Reach-Through Avalanche Photodiodes with Enhanced Sensitivity in the DUV/UV Wavelength Range, MIPRO 2013, May 20-24, 2013, pp. 48-54.

Hecht, Optics, Fourth Edition, India: Pearson Education Pte, Ltd. 2004.

Hecht, Optics, Second Edition, Adelphi University, 1987, Addison-Wesley Publishing Company, Inc., 3 pages.

Henderson, Brian S., Study of Negative Electron Affinity . . . , Dept. of Physics, Rice Univ., Aug. 7, 2009, 18 pgs.

Herriott et al., Folded Optical Delay Lines, Applied Optics 4, #8, pp. 883-889 (1965).

Herriott et al., Off-Axis Paths in Spherical Miccor Interferometers, Applied Optics 3, #4, pp. 523-526 (1964).

Howorth et al., Transmission silicon photoemitters . . . , Jrnl of Physics D: Applied Physics, vol. 9, No. 5, Apr. 1, 1976, pp. 785-794.

Huang et al., Back-Side Illuminated Photogate CMOS . . . , IEEE Sensors Journal, vol. 11, No. 9, Sep. 2011, 5 pgs.

Itzler et al., InP-based Geiger-mode . . . , Proc. SPIE vol. 7320 (2000), 12 pgs.

J. Shaw J. Itoh., "Silicon Field Emitter Arrays (chapter 5)", Vacuum Microelectronics, Wiley-Interscience, 2001, Chapter 5, 187-246 (57 pages).

(56) References Cited

OTHER PUBLICATIONS

KLA-Tencor Coporation, U.S. Appl. No. 62/059,368, filed Oct. 3, 2014 and entitled "183nm Laser and Inspection System".

Koike, AkifumiField Emitter Equipped With a Suppressor to Control Emission Angel, IEEE Electron Device Letters, vol. 34, No. 5, May 2013, 3 pgs.

Kyritsakis and Xanthakis; J.P., "Derivation of a generalized Fowler-Nordheim equation for nanoscopic field-emitters", The Royal Society, Oct. 18, 2014, 2014.0811, 10 pages.

Liu; J. et al., "Modification of Si field emitter surfaces by chemical conversion to SiC", Journal of Vacuum Science & Technology B 12(2), American Institute of Physics, 1994, 6 pages.

Martinelli, Ramon U., Infrared Photoemission from Silicon, Applied Physics Letters, vol. 16, No. 7, Apr. 1, 1970, pp. 261-262.

Martinelli, Ramon U., Reflection and Transmission Secondary Emission . . . , Applied Physics Letters, vol. 17, No. 8, Oct. 15, 1970, pp. 313-314.

Nagao; M. et al., "Damageless vacuum sealing of Si field emitters with CHF3 plasma treatment", Journal of Vacuum Science & Technology B 19(3), American Vacuum Society, May 2001, vol. 19/No. 3, 920-924.

Nagao, Masayoshi, Cathode Technologies for Field Emission Displays, IEEJ Trans 2006; 1:171-178, 8 pgs.

Nagao, MasayoshiFabrication of a Field Emitter Array with a Built-In Einzel Lens, JJAP 48 (2008) 06FK02, 4 pgs.

Nanver et al., Pure-Boron Chemical-Vapor-Deposited Layers: a New Material for Silicon Device Processing, 18th IEEE International Conference on Advanced Thermal Processing of Semiconductors (RTP), Sep. 28, 2010-Oct. 1, 2010, pp. 136-139.

Nanver, Silicon Photodiodes for Low Penetration Depth Beams such as DUV/VUV/EUV Light and Low-Energy Electrons, Advances in Photodiodes, G. Betta, ed., Mar. 22, 2011, pp. 205-224, www.intechopen.com.

Neo, YoichiroElectron Optical Properties of Microcolumn with Field Emitter, JJAP 52 (2013) 036603, 5 pgs.

Niclass et al., Design and Characterization of a CMOS 3-D . . . , IEEE Journal Solid-State Circuits, vol. 40, No. 9, Sep. 2005, 8 pgs.

Nikzad, Shouleh et al., Delta-doped CCDs High QE with long-term stability . . . ; SPIE vol. 2198 (1994) pp. 907-915.

Omatsu et al., High repetition rate Q-switching performance . . . , Optics Express vol. 14, Issue 7, pp. 2727-2734, Apr. 3, 2006.

Paetzel et al., Activation of Silicon Wafer by Excimer Laser, 18th IEEE Conf. Advanced Thermal Processing of Semiconductors—RTP 2010, 5 pgs.

Parker; N. William et al., "High-throughput NGL electron-beam direct-write lithography system", Proceedings of SPIE, Jul. 21, 2000, SPiE 3997, 9 pages.

Petric; Paul et al., "REBL nanowriter: Reflectie Electron Beam Lithography", Proceedings of SPIE, SPIE, Mar. 17, 2009, SPiE 7271, 16 pages.

Rakhshandehroo, M.R. et al, Fabrication of a self-aligned silicon field emission . . . , JVSTB, 16, 765 (1998); doi: 10.1116/1,589900, 6 pgs.

Rakhshandehroo, M.R. et al, Field emission from gated Si emitter tips with precise . . . , JVSTB, 15, 2777 (1997); doi: 10.1116/1.589726, 6 pgs.

Raoult, Efficient generation of narrow-bandwidth . . . , Jul. 15, 1998, vol. 23, No. 14, Optics Letters, pp. 1117-1119.

Sakic, Agata, Boron-layer silicon photodiodes for high-efficiency low-energy electron detection, Solid-State Electronics 65-66 (2011), pp. 38-44.

Sarubbi et al., Chemical Vapor Deposition of α-Boron Layers on Silicon for Controlled Nanometer-Deep p+n Junction Formation, J. Electron. Mat., vol. 39, No. 2, Feb. 2010, pp. 162-173.

Sarubbi et al., Pure boron-doped photodiodes . . . IEEE, Sep. 15, 2008, pp. 278-281.

Sato, T., et al, Fabrication and characterization of HfC coated . . . , J. Vac. Sci. Technol. B 2194), published Jul. 31, 2003, 5 pgs.

Serbun Pavel et al, Stable field emission of single B-doped . . . , JVSTB, 31, 02B101 (2013); doi: 10.1116/1.4765088, 7 pgs.

Slot; E. et al., "MAPPER: high throughput maskless lithography", Proceedings of SPIE, SPIE, Apr. 3, 2008, SPiE 6921, 10 pages.

Sobieski, Stanley, Intensified Charge Coupled Devices for Ultra Low Light Level Imaging, NASA, Goddard Space Flight Center, SPIE vol. 78 (1976) Low Light Level Devices, pp. 73-77.

Stevanovic et al., A CMOS Image Sensor for High-Speed Imaging, 2000 IEEE int'l. Solid-State Circuits Conf., 3 pgs.

PCT-ISR dated Dec. 30, 2020 from PCT/US2020/051344 (KLA Corporation); 3 pages.

* cited by examiner

ELECTRON GUN AND ELECTRON MICROSCOPE

RELATED APPLICATION

This application claims priority from U.S. Provisional Patent Application No. 62/744,890, entitled "ELECTRON SOURCE", which was filed on Oct. 12, 2018, and is incorporated by reference herein. This application also claims priority from U.S. Provisional Patent Application No. 62/885,624, entitled "ELECTRON GUN AND ELECTRON MICROSCOPE", which was filed on Aug. 12, 2019, and is incorporated by reference herein.

FIELD OF THE DISCLOSURE

The disclosure relates generally to electron guns suitable for use in scanning electron microscopes, electron-beam lithography systems, and other systems suitable for reviewing and inspecting samples (e.g., photomasks, reticles, and semiconductor wafers). In particular, the disclosure relates to electrons guns that utilize cold electron field emitters, and to review and inspection systems including these electron guns.

BACKGROUND OF THE DISCLOSURE

The integrated circuit industry requires inspection tools with increasingly higher sensitivity to detect ever smaller defects and particles whose sizes may be a few tens of nanometers (nm), or less. These inspection tools must operate at high speed in order to inspect at least a large fraction of the area of a photomask, reticle, or wafer, in a short period of time. For example, high speed inspections performed during IC production typically take one hour or less. More detailed high speed inspections performed for research and development (R&D) or troubleshooting purposes may take at most, a few hours. High speed inspection tools scan sample surfaces using incident energy beams having pixel or spot sizes larger than the dimensions of the surface defect or particle of interest and monitor the amount of energy deflected from the sample surface, whereby surface defects or undesirable particles are detected by small changes in the amount of deflected energy. High speed inspection is most commonly performed in production using inspection tools operating with ultraviolet (UV) light sources. More detailed high-speed inspection performed in R&D may be performed using electron guns.

Once a defect or particle has been found by high speed inspection, it is often necessary to make a higher resolution image and/or to perform material analysis to determine the origin or type of the particle or defect. This process is commonly called review. Review is usually performed with a scanning electron microscope (SEM). Review SEMs used in semiconductor manufacturing are typically required to review many thousands of potential defects or particles per day, whereby review SEMs are required to operate at speeds that allow, at most, a few seconds to operably scan each defect/particle.

Electron microscopes (e.g., SEMs) utilize electron guns (aka, electron sources) to generate and direct electron beams toward target samples. Thermionic sources usually include a cathode made of tungsten or lanthanum hexaboride ($LaB_6$). During thermionic emission, electrons are boiled off the material surface when the electron thermal energy is high enough to overcome the surface potential barrier. Thermionic emitters typically require elevated temperatures (greater than 1300° K) to operate, and have several drawbacks such as inefficient power consumption, wide energy spread, short lifetime, low current density, and limited brightness.

Although thermionic sources are currently the most common commercially available type of electron gun, the demand for more efficient electron guns has driven the development of Schottky emitters and electron field emitters.

Schottky emitters are typically made of a tungsten wire having a tip coated with a layer of zirconium oxide ($ZrO_x$), which exhibits a much lower work function (~2.9 eV) than conventional thermionic emitters. Schottky emitters exhibit enhanced thermionic emission by effective potential barrier lowering due to the image charge effect under an applied external electric field. However, thermally-assisted Schottky emitters need to be operated at high temperature (>1000 K) and high vacuum (~$10^{-7}$ Torr) and have wider than desirable electron emission energy spread due to the high operating temperature. Therefore, as IC feature sizes (and, hence, defect/particle of interest sizes) continue to shrink, Schottky emitters fail to provide an electron gun with the lower energy spread, higher brightness (radiance), and higher current density that is desirable for semiconductor wafer and mask inspection, review, and lithography.

Electron field emitters (referred to herein as "field emitters") typical consist of a conical emitter tip (cathode), a circular gate aperture and an anode disposed in a vacuum. During operation potential difference is established across the emitter cathode, gate, and anode under an applied external field, resulting in high electric field at the surface of the tip. Field emission takes place when the applied electric field is high enough to reduce the potential barrier on the tip-vacuum interface so that electrons can tunnel through this barrier at room temperature and travel through the gate aperture toward the anode, which is biased at a more positive potential. The electrons in a field emitter are initially in internal thermodynamic equilibrium, and most of the emitted electrons escape by Fowler-Nordheim tunneling from electron states close to the emitter Fermi level (by contrast, in Schottky emitters, most electrons escape over the top of a field-reduced barrier from states well above the Fermi level).

Early field emitter design efforts concentrated on developing metallic field emitters. Among others, Spindt-type molybdenum field emitters are perhaps the most well-known metallic field emitters because molybdenum has a low resistivity (53.4 nΩ·m at 20° C.) and a high melting point (2896 K). Nevertheless, metallic emitters suffer from several disadvantages such as lack of uniformity due to metal deposition techniques, and, more severely, degradation in emission current, mainly due to oxidation.

With the advent of modern semiconductor fabrication technology, there has been investigation of semiconductor field emitters, particularly silicon field emitters. Single-crystal (monocrystalline) silicon is an attractive material for field emitters. Silicon crystals can be grown with very high purity and very few crystal defects. The conductivity of silicon can be altered by doping and/or applying a voltage. More importantly, silicon has a well-developed technology base.

Figure 5:
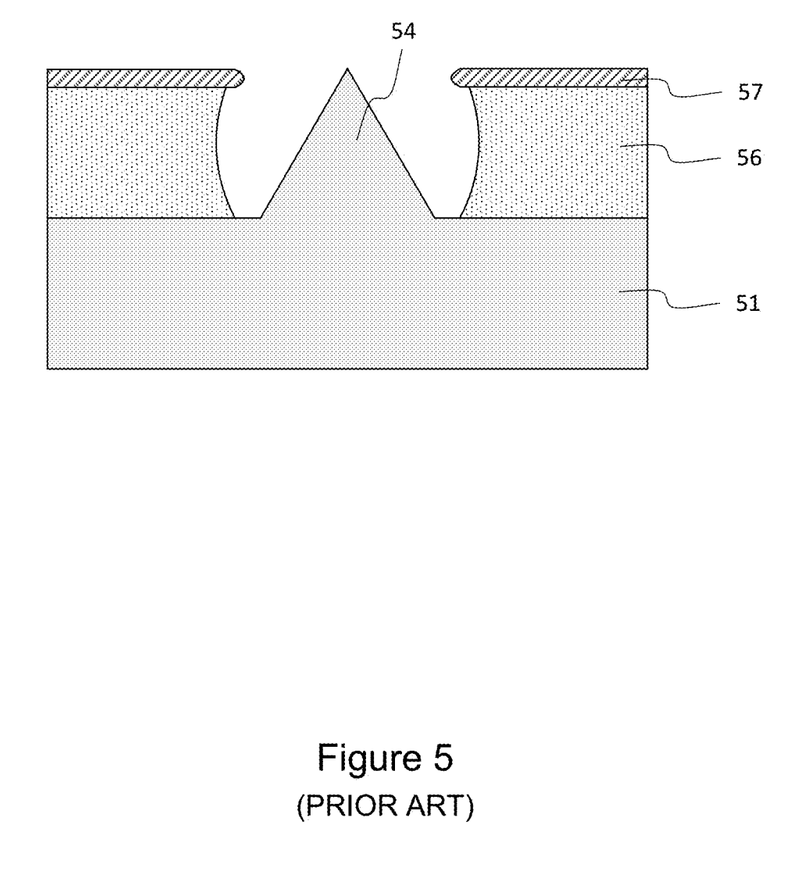
FIG. 5 is a cross-sectional side view illustrating a typical prior-art electron gun comprising a silicon field emitter.

The structure of a typical prior-art silicon field emitter is shown in FIG. 5. A silicon substrate 51 is usually n-type doped. A cone-shaped emitter 54 is formed on the silicon substrate 51, with an optional gate layer 57 attached to a dielectric layer 56, which includes one or more insulating layers. The optional gate layer 57 controls and extracts the emission current. A third electrode (i.e., the anode, not shown) faces the gate layer 57 and is separated at a large distance, on the order of hundreds of microns, from the cathode. This is the typical silicon field emitter triode configuration. Note that without the gate layer 57, the field emitter can be used as a diode. Quantum tunneling of electrons takes place when a bias voltage is applied across the emitter structure. A large electrical field is generated on the surface of the emitter tip, and electrons are emitted from the tip. The production of cold (i.e., room temperature emission) electron guns for SEM instruments for semiconductor inspection/review/lithography instruments that utilized silicon field emitters of this type would address many of the issues associated with Schottky and thermionic emitters.

Even though silicon field emitters have shown promise in recent years, they are not yet commercially available. One serious problem with the use of silicon to form field emitters is that silicon is quite reactive, and can be contaminated within hours, even at pressures around $10^{-10}$ torr (see for instance, J. Shaw, and J. Itoh, "Silicon Field Emitter Arrays," in Vacuum Microelectronics, W. Zhu, ed. (Academic, 2001), pp. 187-246). Silicon very readily forms a native oxide on its surface. Even in a vacuum, a native oxide will eventually form as the small amounts of oxygen and water present in the vacuum will react with the surface of the silicon. The interface between silicon and silicon dioxide has defects (due to dangling bonds) where the probability of an electron recombination is very high. Furthermore, the band gap of silicon dioxide is large (about 9 eV) creating an additional barrier higher than the work function that an electron has to overcome in order to escape, even if the oxide is very thin. For example, native oxide on a very smooth silicon surface is typically about 2 nm thick. In some circumstances, oxidation can also change the shape of the field emitters. These aforementioned problems may result in low brightness and current as well as poor stability, reliability, scalability and uniformity, and have hindered the commercial use of silicon field emitters. Periodic flashing (i.e., temporarily raising the tip temperature) is required to remove those contaminants, during which time the system/instrument in which the cold electron gun is implemented remains unavailable for use (i.e., the collect higher resolution images and/or to performing material analysis must be suspended while the tip is being flashed). This presents a particularly significant problem in the semiconductor industry, where inspection/review/lithography instruments are expected to operate continuously and stably without interruption for long periods. Accordingly, most commercially available SEM instruments utilized for semiconductor inspection/review/lithography include electron guns that implement Schottky emitters.

Research effort has been expanded in looking for surface treatments and coatings for field emitters to improve their performance for lower turn-on voltages, higher emission current densities, lower noise, and improved stability. These treatments may include coating the emitter tips with refractory metals, silicides, carbides, and diamond, etc. However, these coating materials are usually limited by the fabrication process in forming smooth and uniform coating surfaces, and/or are often affected by the oxide layer formed on the coating surfaces, creating an additional energy barrier. For these reasons, cold electron guns that utilize coated silicon field emitters have not yet become practical.

What is therefore needed is an electron gun that overcomes some, or all, of the limitations of the prior art, and an electron microscope incorporating such an electron gun.

SUMMARY OF THE DISCLOSURE

The present invention is directed to an electron gun for use in SEMs or other devices/instruments, where the electron gun includes a field emitter (cathode) having one or more field emitter protrusions integrally connected to a monocrystalline (single crystal) silicon substrate such that the protrusion(s) extending from an output (second) surface of the silicon substrate, and a substantially pure silicon-carbide (SiC) layer (i.e., consisting of at least 75% SiC) hermetically disposed on at least a tip (free end) portion of the field emitter protrusion. The SiC layer is formed on the protrusion(s) such that, during operation, electrons leaving the monocrystalline silicon substrate through the tip portion only pass through the SiC layer before forming a primary electron beam. The integral connection of the field emitter protrusion to the silicon substrate (i.e., by way of etching portions of the single crystal silicon substrate such that a remaining un-etched portion of single crystal silicon forms the protrusion) circumvents the silicon substrate's relatively high work function by taking advantage of the field enhancement generated when the substrate is subjected to an applied external electric field that is high (strong) enough to reduce the potential barrier outside the tip portion, whereby electrons are able to tunnel through the reduced potential barrier (i.e., by way of quantum-mechanical tunneling). Moreover, the use of a contiguous substantially pure SiC layer to hermetically seal the field emitter protrusion provides several advantages over conventional surface treatments and coatings: first, various techniques are known for forming a substantially pure SiC layer as a pin-hole free coating that prevents the formation of native oxide on the output surface of the field emitter protrusion; second, substantially pure SiC layer has a lower bandgap than conventional coatings such as silicon dioxide, thereby increasing the flow of electrons during operation; and third, the SiC layer can withstand processing temperatures over 400° without significant change in its composition or work-function allowing for vacuum bakeout of an electron gun incorporating such an emitter at temperatures of 200° C. or higher. Thus, by producing an electron gun with a field emitter including field emitter protrusions integrally formed on a single-crystal silicon substrate and hermetically protected by a substantially pure SiC layer, the present invention facilitates the production of cold electron guns having the beneficial qualities of silicon (i.e., sub-1 μm wavelength absorption, high purity/low defect material, and long electron recombination times), while avoiding the negative aspects that have previously prevented the widespread commercial production of cold electron guns that utilize coated silicon field emitters.

The electron gun of the present invention circumvents silicon's relatively high work function by taking advantage of the field enhancement due to the field emitter protrusion. A second electrode (i.e., the anode) is positioned facing the field emitter cathode. The anode may be made of a metal such as tungsten, molybdenum, or stainless steel. A high voltage source, typically on the order of kilovolts, is utilized to generate an external potential difference between the field emitter protrusion and the anode in order to create a strong electric field near the tip of the field emitter protrusion causing electrons to preferentially move toward the emitter tip. When a high potential difference between the field emitter protrusion and anode (such as a voltage of about 1 kV or higher) is used, the anode should preferably be about 50 μm away from the field emitter protrusion. In one embodiment, the anode is placed at least 50 μm from the emitter tip, at a positive voltage of at least 500 V relative to the field emitter protrusion. In an alternative embodiment, the anode is placed close to the emitter tip, such as a distance of about 2 µm or less, at a potential of less than 100 V positive to the emitter. Placing the anode closer to the emitter tip allows a sufficiently strong electric field to be generated from a smaller voltage, which has the advantage of minimizing back-bombardment of the emitter by highly energetic ions that can reduce the lifetime of the emitter. However, placing the anode closer to the emitter tip requires more precise alignment of the aperture in the anode relative to the emitter tip.

Field emission takes place when the applied electric field is high enough to reduce the potential barrier on the silicon-vacuum interface so that the electron can tunnel through this barrier (i.e., quantum-mechanical tunneling). In a semiconductor, where the electron concentration is determined by the local doping level and potential, it is possible to configure field emitters to be operated in reverse bias mode as in a p-n diode, in which a depletion layer is generated due to the high electric field at the emitter surface. The interface between vacuum and a SiC-coated, p-type doped field emitter protrusion can form a p-n junction, in which the vacuum is considered to be an n-type medium. In this case, the conduction and valence bands will bend downward at the surface. If the electric field is sufficient to bring the bottom of the conduction band below the Fermi energy level, there will be an abundance of electrons at the apex of the emitter tip, and an electric current, on the order of nA to µA is produced. In an alternative embodiment, the electric field may be kept at a slightly lower level so that the bottom of the conduction band stays just above the Fermi level and little or no emission current is generated. In this embodiment, light may be used to create electron-hole pairs. The electrons so created will be strongly attracted towards the tip and many will be emitted from the tip as an emission current. In this embodiment, the emission current may be controlled by controlling the light level incident on, or near, the field emitter substrate. In yet another embodiment, the bulk of the silicon wafer may be n-type doped, so that an abundance of electrons is available to form the emission current. The emission current density can be estimated by a modified version of the Fowler-Nordheim theory, which takes into account the field enhancement factor due to the field emitter protrusion. Thus, by producing an electron emitter structure having both a SiC layer and a field emitter protrusion formed on the single-crystal silicon substrate, the present disclosure provides the beneficial qualities of silicon (i.e., high purity/low defect material, long electron recombination times, and mature silicon-based fabrication process), and enables the enticing features of field emitters (i.e., small emitter size, low power consumption, high brightness, high current density, high speed, and long emitter lifetime), while avoiding the negative aspects that have previously prevented the widespread commercial use of silicon-based field emitter structures.

According to various alternative embodiments of the present disclosure, various additional layers and structures are utilized to further enhance the beneficial qualities of the disclosed emitter structure. In some embodiments, one or several gate layers, or control electrodes, are placed at, slightly lower than, or slightly lower than the height of the field emitter protrusion (i.e., from base to tip) in order to further enhance the electric field at the emitter tip, and to achieve fast and accurate control of the emission current. The gate layer is typically formed on top of one or several insulating layers deposited on the substrate. If there are several gate layers, the insulating layers are the spacers in between these gate layers. In yet other embodiments, multi electron-beam guns comprise a plurality of the disclosed field emitter protrusions arranged in a two-dimensional periodic pattern (e.g., a Field Emitter Array (FEA)) disposed on the emitter surface for emitting electrons in the presence of an electric field.

In accordance with embodiments of the present disclosure, the electron guns disclosed herein are incorporated into inspection, metrology, and review scanning electron microscopes (SEMs). An SEM typically includes an electron gun, electron optics, and a detector. The electron optics can be configured to de-magnify and focus the primary electron beam onto the sample and the detector can be configured to detect at least one of back-scattered electrons and secondary electrons from the sample. The electron gun generates a primary electron beam that is directed toward a sample. The electron gun includes a SiC-coated silicon field emitter protrusion or a plurality of SiC-coated silicon field emitter protrusions. The electron gun may be configured to operate the silicon-based field emitter as a diode or a triode. The electron optics de-magnifies and focuses the primary electron beam onto the sample. The electron optics also include deflectors that can scan the primary electron beam across an area of the sample. When the primary electron beam strikes the sample, the sample absorbs many of the electrons from the primary electron beam, but scatters some of the electrons (back-scattered electrons). The absorbed energy causes secondary electrons to be emitted from the sample along with X-rays and Auger electrons. The secondary electrons are collected by a secondary electron detector. The back-scattered electrons may be collected by a back-scattered electron detector.

In alternative embodiments, the present invention is directed to a device that incorporates the electron gun described herein. The device may be a scanning electron microscope (SEM) in which the electron optics are configured to de-magnify and focus the primary electron beam onto the sample. The device can further comprise a detector for detecting at least one of back-scattered electrons and secondary electrons from the sample. In another embodiment, the device may be an electron-beam lithography system in which the electron optics are configured to de-magnify and focus the primary electron beam onto the target. The device may further comprise a modulator for modulating the intensity of the electron beam.

BRIEF DESCRIPTION OF THE DRAWINGS

The present disclosure is illustrated by way of example, and not by way of limitation, in the figures of the accompanying drawings in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The following description is presented to enable one of ordinary skill in the art to make and use the disclosure as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present disclosure is not intended to be limited to the particular embodiments shown and described, but is to be accorded the widest scope consistent with the principles and novel features herein disclosed.

Figure 1:
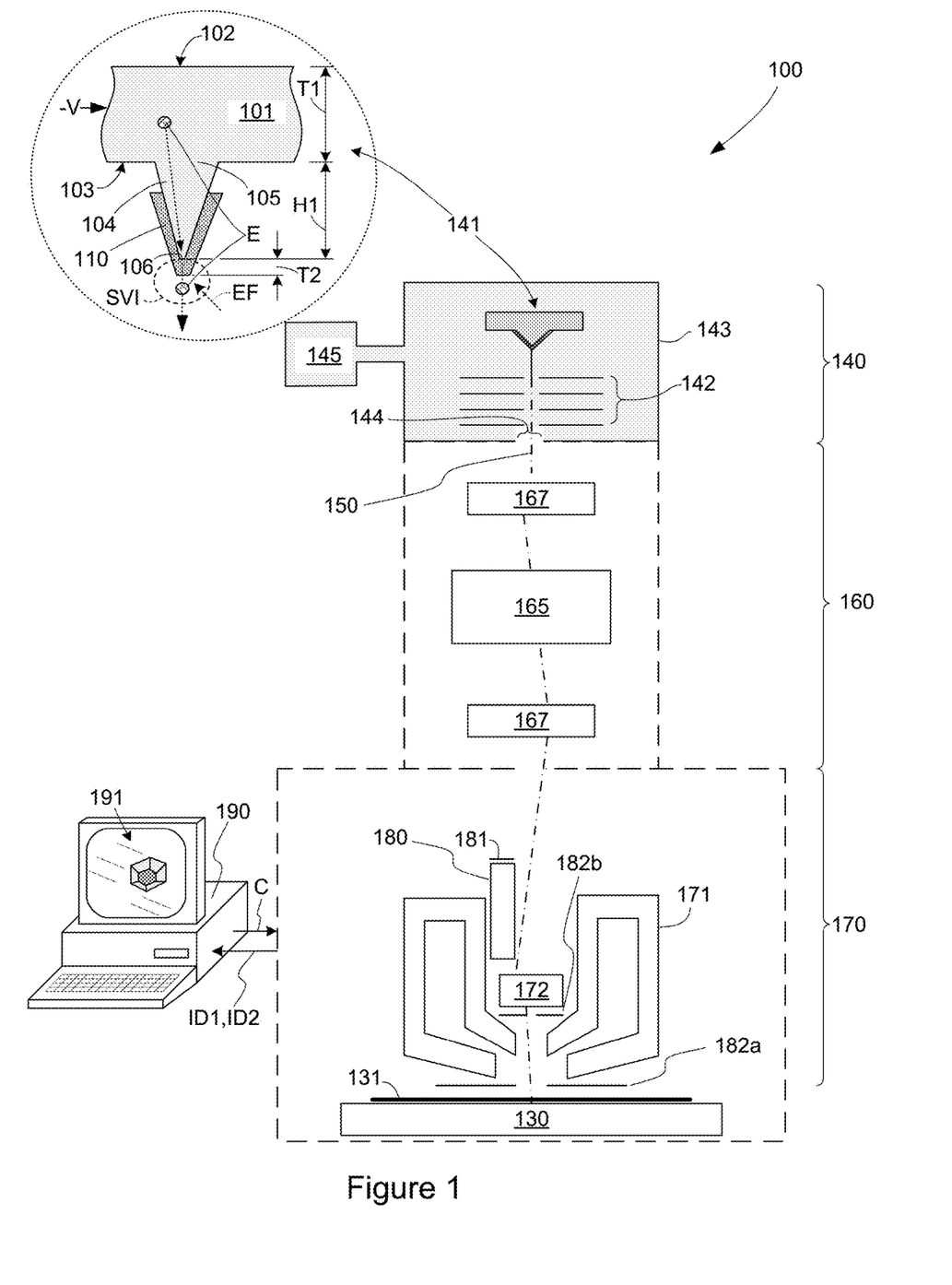
FIG. 1 illustrates an exemplary SEM incorporating an embodiment of an electron gun, electron optics, a back-scattered electron detector, and a secondary electron detector in accordance with the present disclosure.

FIG. 1 illustrates an exemplary inspection, metrology, or review scanning electron microscope (SEM) system 100 configured to inspect or review a sample 131 such as a semiconductor wafer, reticle, or photomask. SEM system 100 includes an electron gun 140, electron optics disposed in an upper column 160 and a lower column 170 and configured to focus and direct primary electron beam 150 to the sample 131, one or more detectors disposed in lower column 170 to detect electrons deflected from sample 131, and a system computer 190.

Electron gun 140 includes a silicon field emitter (cathode) 141 and electrodes 142 disposed inside a chamber 143. Field emitter 141 is configured in a diode or triode configuration to emit electrons that travel through an applied electric field generated by electrodes 142 (which may include an anode) to form a primary electron beam 150 having a desired beam energy and beam current, usually on the order of 1 nA to 1 µA that passes through a small aperture 144 out of chamber 143. Electron gun 140 may further comprise a magnetic lens (not shown). The interior of chamber 143 is maintained under high vacuum conditions during operation by a pump 145 in order to protect field emitter 141 from contaminants and to minimize bombardment by high energy ions. Adequate vacuum conditions for electron gun 140 may be maintained while allowing primary electron beam 150 to pass into upper column 160 by way of aperture 144. Vacuum pump 145 preferably includes at least one of an ion pump and a getter pump. Aperture 144 preferably has a diameter between about 100 µm and about 2 mm. Aperture 144 may function as both a beam limiting aperture and a differential pumping aperture. In a preferred embodiment, chamber 143, aperture 144 and vacuum pump 145 are collectively configured to maintain field emitter cathode 141 at a vacuum level of less than about $10^{-10}$ Torr during operation of electron gun 140.

Referring to the upper left portion of FIG. 1, field emitter cathode 141 generally includes a monocrystalline silicon substrate 101 including at least one integrally connected field emitter protrusion 104. Silicon substrate 101 is essentially defect-free and has a thickness T1 in the range of about 10 nm to about 800 µm, as measured between a flat (first) surface 102 and an opposing output (second) surface 103. In one embodiment silicon substrate 101 is p-type doped with a doping level less than about $10^{19}$ cm$^{-3}$. In another embodiment silicon substrate 101 is n-type doped with a doping level between about $10^{15}$ and $10^{19}$ cm$^{-3}$. Field emitter protrusion 104 has a fixed base portion 105 that is integrally connected to silicon substrate 101 and extends away from surface 103 to tip (free end) portion 106. In an exemplary practical embodiment, a height H1 measured in a direction perpendicular to surface 103 from base 105 to tip portion 106 is in the range of 0.5 µm to 5 µm, preferably not more than about 2 µm. In one embodiment, field emitter protrusion 104 is fabricated using standard CMOS fabrication techniques by etching or otherwise removing portions of the single-crystal material forming substrate 101 (i.e., such that field emitter protrusion 104 and the remainder of substrate 101 are remaining parts of the same single-crystal structure). For example, forming field emitter protrusion 104 may be achieved by depositing a silicon dioxide or silicon nitride mask using plasma-enhanced chemical vapor deposition (PECVD) over surface 103 of substrate 101, then patterning the mask over a portion of surface 103 using photolithography while exposing portions of surface 103 surrounding the masked portion, and then utilizing a dry etching process (e.g., reactive-ion-etching (RIE), inductively coupled plasma (ICP) etching, or electron cyclotron resonance (ECR) etching), a wet etching process, or a combination of dry and wet etching such that portions of the single-crystal material are removed, leaving protrusion 104 surrounded by surface 103. In alternative specific embodiments, field emitter protrusion 104 may be formed with various cantilever shapes, such as rounded whiskers (cylindrical posts with round tips), rounded cones, or pyramids.

According to an aspect of the present invention, contiguous substantially pure SiC layer 110 is hermetically disposed at least on a tip portion 106 field emitter protrusion 104 such that, during operation, electrons leaving substrate 101 through tip portion 106 to form primary electron beam 150 only pass through contiguous substantially pure SiC layer 110 (i.e., no other materials/layers are formed on SiC layer 110 adjacent tip portion 106). As used herein the phrase "hermetically disposed" is defined as being formed in the near absence of oxygen and forming an airtight seal on at least tip (free end) portion 106 of field emitter protrusion 104. As used herein the term "contiguous" in relation to SiC layer 110 is defined as meaning that SiC layer 110 is unbroken across a designated portion of substrate 101 that at least includes the region of tip portion 106 from which electrons are emitted. That is, the majority of the electron emission from field emitter protrusion 104 exits a region of tip portion 106 having a size, for example, on the order of tens of nm in radius, and this region is covered by SiC layer 110 in a contiguous (unbroken) manner. In other embodiments, SiC layer 110 is contiguous over a larger portion of the peripheral surface of field emitter protrusion 104 that includes tip portion 106, or may be contiguous over an even larger area including the entire peripheral surface of field emitter protrusion 104 some or all of output surface 103 that surrounds base portion 105 of field emitter protrusion 104.

Various known techniques may be used to form contiguous substantially pure SiC layer 110. In one specific embodiment, SiC layer 110 is formed using $CHF_3$ plasma treatment on clean silicon in a manner that produces a protective, contiguous SiC layer having a thickness in the range of 1 nm to 10 nm including all ranges and values to the 0.1 nm therebetween (as described, for example, by M. Nagao, T. Matsukawa, S. Kanemaru, and J. Itoh, "Damageless vacuum sealing of Si field emitters with $CHF_3$ plasma treatment", J. Vac. Sci. Technol. B, Vol. 19, No. 3, May/June 2001, pp. 920-924). In another specific embodiment, SiC layer 110 is formed using the carburization process, that is, by reacting with ethylene gas at temperatures between 850 and 950° C. using pressures as high as $5 \times 10^{-3}$ Torr (as described, for example, by J. Liu, U. T. Son, A. N. Stepanova, K. N. Christensen, G. J. Wojak, E. I. Givargizov, K. J. Bachmann, and J. J. Hren, "Modification of Si field emitter surfaces by chemical conversion to SiC", J. Vac. Sci. Technol. B, Vol. 12, No. 2, March/April 1994, pp. 717-721). When formed using these techniques, contiguous, substantially pure SiC layer 110 circumvents silicon's oxidation problem by reliably and hermetically sealing the silicon surface against oxidation. SiC layer 110 may include various impurities, such as additional silicon atoms, additional carbon atoms or oxygen atoms may be present on any of the SiC—Si interface, the outer layer surface or within the crystal lattice. For example, the carbon-to-silicon ratio may vary at the interface between SiC layer 110 and substrate 101. Note that SiC layer 110 may include a few atomic percent of oxygen (such as less than 10% or less than 5%) remaining at the interface between SiC layer 110 and the silicon surface of protrusion 104, but that this oxygen content likely will not significantly increase over time (such as over a time period of one year) because of the hermetic sealing. Such a low oxygen to silicon ratio means that there is no contiguous silicon dioxide layer at the interface, so that electrons are easily able to leave the silicon surface through the portion of SiC layer 110 covering tip portion 106. Note that immediately after forming SiC layer 110, an outer surface of SiC layer 110 may be covered by a thin layer (such as a few monolayers) which may comprise carbon, hydrocarbons, fluorinated hydrocarbons or other compounds. This thin layer may be removed immediately prior to using electron field emitter 140. Thus, SiC layer 110 can comprise, consist of, or consist essentially of 1:1 (silicon-to-carbon ratio) SiC material. Substantially pure SiC layer 110 may comprise greater than 75% 1:1 SiC material (e.g., in alternative specific embodiments, SiC layer 110 may include greater than 80% 1:1 SiC material, greater than 85% 1:1 SiC material, greater than 90% 1:1 SiC material, greater than 95% 1:1 SiC material, greater than 96% 1:1 SiC material, greater than 97% 1:1 SiC material, greater than 98% 1:1 SiC material, or greater than 99% 1:1 SiC material, where all percentage values are atomic percent).

By producing electron gun 140 in the manner set forth above, the present invention provides a cold electron gun with coated silicon field emitters that overcomes limitations associated with conventional approaches. The integral connection of field emitter protrusion 104 circumvents the silicon substrate's relatively high work function by taking advantage of the field enhancement generated when silicon substrate 101 is subjected to an applied external electric field EF that is high (strong) enough to reduce the potential barrier outside tip portion 106, whereby electrons E are able to tunnel through the reduced potential barrier (i.e., by way of quantum-mechanical tunneling). The resulting electron emission current density can be estimated by a modified version of the Fowler-Nordheim theory (R. Fowler and L. Nordheim, "Electron emission in intense electric fields", Proceedings of the Royal Society of London A, Vol. 119, No. 781, May 1928, pp. 173-181). Moreover, by forming contiguous substantially pure SiC layer 110 such that it hermetically seals tip portion 106, oxidation of the field emitter output surface is substantially entirely prevented, thereby avoiding the significant barrier to electron escape caused by oxidation in conventional approaches. Thus, by producing electron gun 140 with a field emitter cathode 141 including protrusion 104 integrally formed on single-crystal silicon substrate 101 and hermetically protected by contiguous substantially pure SiC layer 110, the present invention provides a cold electron gun having the beneficial qualities of silicon (i.e., sub-1 μm wavelength absorption, high purity/low defect material, and long electron recombination times), while avoiding the negative aspects that have previously prevented the widespread commercial production of cold electron guns that utilize coated silicon field emitters.

Referring to the central portion of FIG. 1, upper column 160 of SEM 100 includes one or more condenser lenses 165 that de-magnify the primary electron beam 150 such that an incident portion of primary electron beam 150 primarily falls within a spot area on an upper surface of sample 131 having a nominal diameter on the order of 20 nm or less. One or more optional deflectors 167 may be placed on one or both sides of condenser lens 165 to adjust (i.e., align, tilt and/or shift) primary electron beam 150 using known techniques.

Lower column 170 includes a final lens 171 configured to focus primary electron beam 150 onto sample 131 such that incident electrons strike sample 131 within the desired spot area, and includes various detectors 181, 182a and 182b that receive redirected electrons from sample 131. Lower column 170 also includes one or more deflectors 172 that work in combination with deflectors 167 (if present) to scan primary electron beam 150 across an area of the sample 131. In one embodiment sample 131 is placed on a stage 130 in order to facilitate movement relative to electron gun 140 (i.e., to position different surface regions of sample 131 underneath the electron column). Incident electrons of primary electron beam 150 strike the surface of sample 131 and are deflected or otherwise scattered in directions that are determined by the struck surface features of sample 131, thereby producing secondary electrons and back-scattered electrons that move away from sample 131 (e.g., in the upward direction in FIG. 1). Secondary electrons may be collected and accelerated by electrodes 180 and directed to secondary electron detector 181 for detection. Back-scattered electrons may be detected by a back-scattered electron detectors 182a and 182b. In one embodiment, each electron detector 181, 182a and 182b is a solid-state device including at least one analog-to-digital converter that converts analog output signals generated in accordance with a number of received electrons to a digital form for transmission as one or more digital image data signals to computer 190 (i.e., image data signal ID1 generated by secondary electron detector 181, and/or signal ID2 generated by back-scattered electron detectors 182a or 182b). Computer 190 is configured to process image data signals ID1 and ID2, and is configured to generate an image 191 of the area of sample 131 over which primary electron beam 150 was scanned using known techniques.

While FIG. 1 depicts the configuration and operation of an electron gun 140 integrated into an SEM 100, the electron guns disclosed herein also can be incorporated into other devices such as, for example, an electron-beam lithography system including electron optics configured to de-magnify and focus the primary electron beam onto a target, and a modulator for modulating the intensity of the electron beam.

Figure 2:
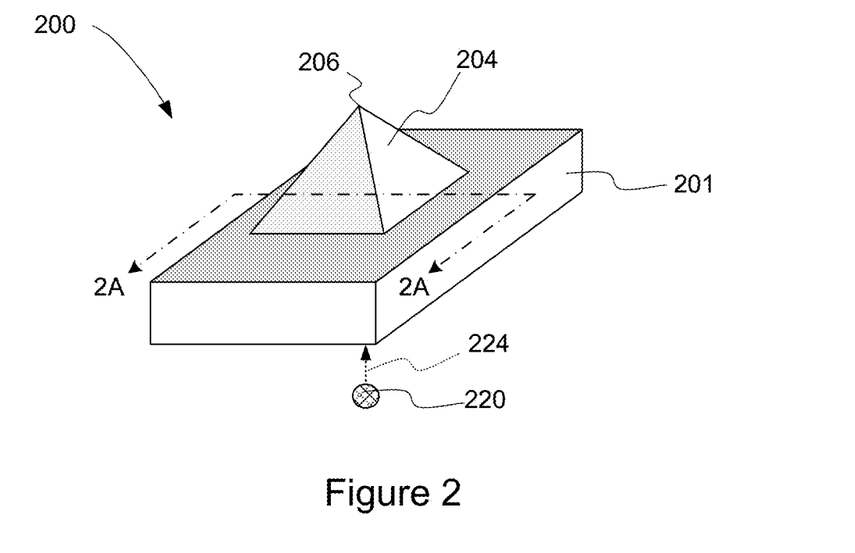
FIG. 2 is a perspective view illustrating an electron gun in a diode configuration including a SiC-coated silicon field emitter protrusion formed on a silicon substrate according to an exemplary embodiment of the present disclosure.
Figure 2A:
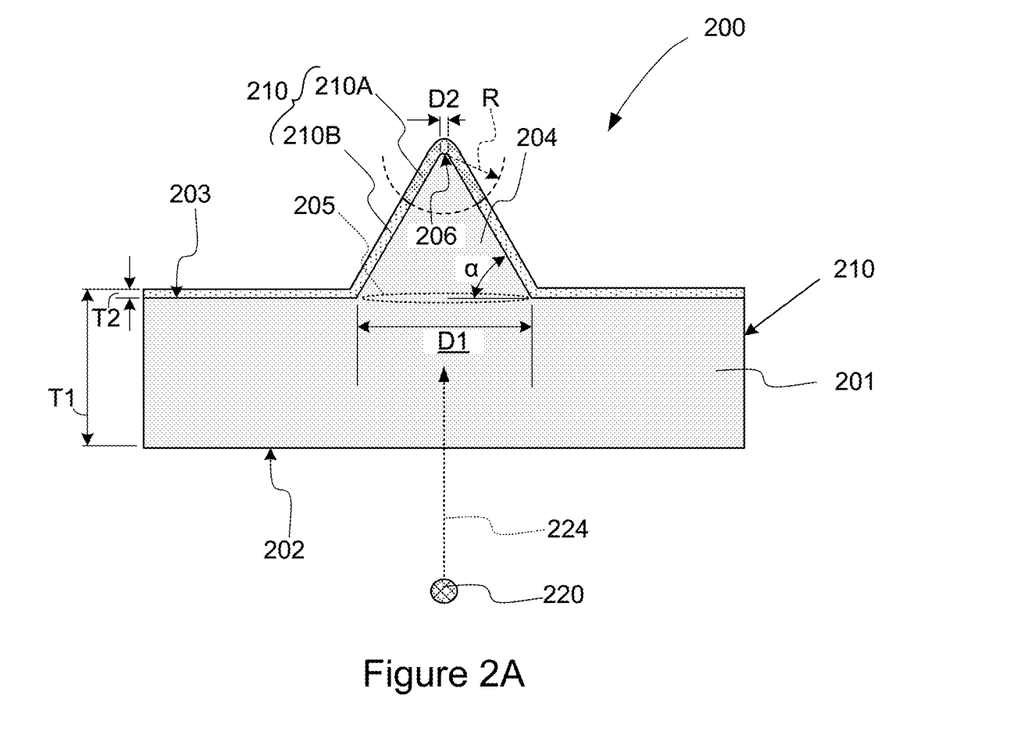
FIG. 2A is a cross-sectional view showing the electron gun of FIG. 2.

FIG. 2 illustrates in partial perspective view showing the cathode portion of an electron gun 200 including a field emitter protrusion 204 integrally connected to a substrate 201 according to an exemplary embodiment of the present disclosure, and FIG. 2A shows the cathode portion of electron gun 200 in a cross-sectional view taken along lines 2A-2A of FIG. 2. Electron gun 200 also includes electrodes such as an anode (not shown, but see electron gun 140 in FIG. 1) facing protrusion 204. The anode may be separated by a distance between about one micron and a few hundred microns from a tip portion 206 of protrusion 204. As in the previous embodiment, the field emitter cathode is formed on a silicon substrate 201 having an upward-facing output surface 203 from which field emitter protrusion 204 extends, and a contiguous SiC layer 210 disposed on output surface 203 and entirely covering field emitter protrusion 204. As indicated in FIG. 2, field emitter protrusion 204 has a pyramidal shape that can be made by anisotropic etching, which may have a slope angle α close to 54.7° (see FIG. 2A) since that angle corresponds to the intersection of the (100) and (111) planes in monocrystalline silicon. Oxidation sharpening, which may be performed at a low to moderate temperature (less than about 950° C.), may be used prior to forming SiC layer 210 when a sharp field emitter tip portion 206 is desired. The apex of the sharpened tip portion 206 may comprise, at atomic scale lengths, a substantially flat area, such as a surface substantially parallel to a crystal plane of the silicon crystal, for example substantially parallel to a (100) plane. In FIG. 2A, a characteristic lateral dimension (e.g., diameter) of base region 205 is indicated by dimension D1 and that of tip region 206 is indicated by dimension D2. In a preferred embodiment the ratio of the lateral dimension D1 to the height H1 of the field emitter protrusion (see FIG. 3) is in the range of about one and about three, and diameter D2 may be between about 5 nm and about 50 nm. The anode (not shown) may be made of a metal such as tungsten, molybdenum, and stainless steel among others. A voltage source is utilized to generate an external potential difference between the cathode and the anode in order to cause electrons to preferentially move toward tip portion 206 of field emitter protrusion 204. Electron gun 200 operates similarly to a typical cold electron gun in that, when a strong electric field (such as a field between about 100 V $\mu m^{-1}$ and about 10 kV $\mu m^{-1}$) is applied to tip portion 206, electrons have a high probability of being emitted from substrate 201 through the output surface 203 of the field emitter 204, most often from near tip portion 206 of the field emitter 204. As explained above, SiC layer 210 is formed using a process that hermetically seals tip 206 against oxidation. To ensure that the SiC layer 210 provides a good hermetic seal without forming a strong barrier to electron emission, the thickness T2 of the SiC layer 205 may be between about 1 nm and 10 nm. Even if a few percent of oxygen remain at the interface between silicon substrate 201 and SiC layer 210, no more oxygen is able to penetrate SiC layer 210, so no significant further oxidation occurs near the silicon/SiC interface. Since the electron emission occurs from a small region near the apex of tip portion 206, the quality of the SiC layer 210 near tip portion 206 is of highest important. Accordingly, according to an embodiment, a portion 210A of SiC layer 210 that is within a radius R of tip portion 206 (shown in FIG. 2A) is formed without pinholes, where radius R equals 100 nm or less. In portions 210-B of SiC layer 210 that are located outside of radius R, a few pinholes or gaps in the coverage of the SiC layer 210 or a change in the composition of the SiC layer 210 will typically not affect the emission and can be tolerated.

In addition to being substantially pure SiC, being contiguous in the region of tip portion 206, and forming a hermetic seal as described above with reference to SiC layer 110, in some embodiments SiC layer 210 may be formed with a thickness T2 in a range of 1 nm to 2 nm, may have a uniform thickness, or may be formed with a different thickness on field emitter protrusion 204 than on the rest of output surface 203.

According to an aspect of the present disclosure, silicon substrate 201 can comprise monocrystalline silicon (i.e., a single crystal of silicon) that is p-type doped with a doping level less than about $10^{19}$ $cm^{-3}$ (i.e., a resistivity of about 0.005 Ω·cm or higher). Since minority carrier lifetime and diffusion length decrease with increasing dopant concentration, dopant concentrations higher than about $10^{19}$ $cm^{-3}$ may be used when the silicon is very thin, such as thinner than about 1 μm, whereas when the silicon is thicker than about 1 μm, dopant concentrations lower than about $10^{19}$ $cm^{-3}$ may be preferred. For silicon that is thicker than a few microns, such as a thickness of 10 μm or more, much lower dopant concentrations, such as less than about $10^{14}$ $cm^{-3}$, may be preferred to ensure long carrier lifetime and low dark current. Since electrons are a minority carrier in p-type doped silicon, one embodiment using p-type silicon electron gun 200 includes an optional light source 220 configured to shine light 224 through backside surface 202 to create electron-hole pairs within silicon substrate 201. Light source 220 preferably comprises a high-intensity light source such as a laser diode or a high brightness LED, preferably having a bandwidth of about 20 nm or less. In alternative embodiments, light source 220 may be placed behind substrate 201 to illuminate backside surface 202 as shown or may be positioned to illuminate output surface 203 (i.e., located above substrate 201 instead of below substrate 201 as shown in FIG. 2A). When the light source 220 is placed below substrate 201 as shown, light source 220 is configured to emit a light wavelength that penetrates relatively deep into the silicon, such as a wavelength longer than about 500 nm, in order to create electron-hole pairs away from bottom surface 202 of silicon substrate 201. When light source 220 illuminates field emitter protrusion 204 from the top side, a shorter wavelength that penetrates more shallowly into the silicon, such as a wavelength shorter than about 550 nm, may be preferred in order to create electron-hole pairs relatively close to tip portion 206 of field emitter protrusion 204. In one embodiment, light source 220 is configured such that an emission current of the primary electron beam generated by electron gun 200 (e.g. see beam 150 in FIG. 1) is controllable in proportion to an amount of light 224 transmitted from light source 220 into silicon substrate 201.

In an alternative embodiment, the silicon may be n-type doped with a dopant concentration of about $10^{15}$ $cm^{-3}$ or greater. For example, the silicon may be n-type doped with a dopant concentration between about $10^{15}$ $cm^{-3}$ and $10^{19}$ $cm^{-3}$. Silicon with n-type doping has many electrons available in the conduction band, which may be drawn toward tip portion 206 of field emitter protrusion 204 to form the emission current. When using n-type doped silicon, the emission current may be controlled by adjusting a voltage on a gate electrode (such as an electrode within the extraction and focusing electrodes 142 in FIG. 1, or gate 330 in FIG. 3) or by adjusting the voltage difference between the anode and the field emitter cathode. When n-type doped silicon is used, the optional light source 220 may be omitted. In either case, field emitter protrusion 204 may be formed using the process described above for the formation of field emitter protrusion 104.

According to another aspect of the present disclosure, the field emitter cathode structure of electron gun 200 may be configured to operate in reverse bias mode as in a p-n diode, in which a depletion layer is generated due to the high electric field at output surface 203. The interface between vacuum and a SiC-coated, p-type doped field emitter can form a p-n junction, in which the vacuum is considered to be an n-type medium. In this case, the conduction and valence bands will bend downward at the surface. If the electric field is sufficient to bring the bottom of the conduction band below the Fermi energy level, there will be an abundance of electrons at the apex of tip portion 206, and an electric current, on the order of 1 nA to 1 µA, is produced. Field emission takes place when the applied electric field is high enough to reduce the potential barrier on the silicon-vacuum interface so that electrons can tunnel through this barrier (quantum-mechanical tunneling). The emission current density can be estimated by a modified version of the Fowler-Nordheim theory, which takes into account the field enhancement factor due to the field emitter.

According to another aspect of the present disclosure, SiC layer 210 comprises a contiguous SiC film that is disposed directly on the output surface of the field emitter. As used herein, the phrase "directly on" in conjunction with the SiC-to-silicon interface is intended to mean that there are no continuous intervening layers (e.g., oxide or $SiN_x$ layers) separating output surface 203 of the field emitter cathode and SiC layer 210 other than a possible thin layer (i.e., a few monolayers) of SiC (x<1) that may form at the Si/SiC interface. Note also that the phrase "directly on" does not preclude the presence of a small amount of oxide between some portions of the SiC and silicon. SiC layer 210 is grown on clean silicon using known techniques such that the SiC forms a pin-hole free coating on at least field emitter protrusion 204 having a thickness T2 in the range of approximately 1 nm to 10 nm, such as approximately 1 to 4 nm, including all ranges and values to the 0.1 nm therebetween. Other sections of the coating may include pin-hole defects outside of the coating on the field emitter protrusion 204 or the coating may be entirely pin-hole free. In an instance, presence of pin-hole defects are minimized outside of the field emitter protrusion 204.

All native oxide may be removed from the silicon by, for example, a wet clean followed by an in-situ etch prior to forming SiC layer 210. An advantage of SiC layer 210 is that such a pin-hole free coating, when applied to a clean silicon surface, prevents formation of a native oxide on the output surface of the field emitter. As previously described, a silicon dioxide layer has a high band gap and even thin layers can block a significant fraction of electrons from leaving the silicon. Thus, the SiC layer 210 allows even electrons with low energies to leave the silicon field emitter protrusion 204. Formed on the silicon substrate 201, field emitter protrusion 204 circumvent limitations of previous electron emitters and the sharp emitter provides field enhancement and high emission current. In addition, previous silicon devices could not avoid a silicon dioxide interface layer from forming between the silicon and the low work-function material, even if the silicon layer was free of oxide when coated. That is, without an impervious pin-hole-free protection layer on the silicon, oxygen would eventually migrate to the silicon surface and form an oxide layer. An advantage of forming layer 210 using SiC is that even a thin pin-hole-free SiC layer is impervious to oxygen and hermetically seals the silicon. Since most of the electron emission occurs from a small region near the apex of the field emitter protrusion, the lack of pin holes may only be needed within a few hundred nm of the apex of the field emitter. Another advantage of SiC layer 210 is that the density of defects and interface traps at the silicon to SiC interface is typically lower than at the silicon to silicon dioxide interface leading to higher emission current.

Figure 3:
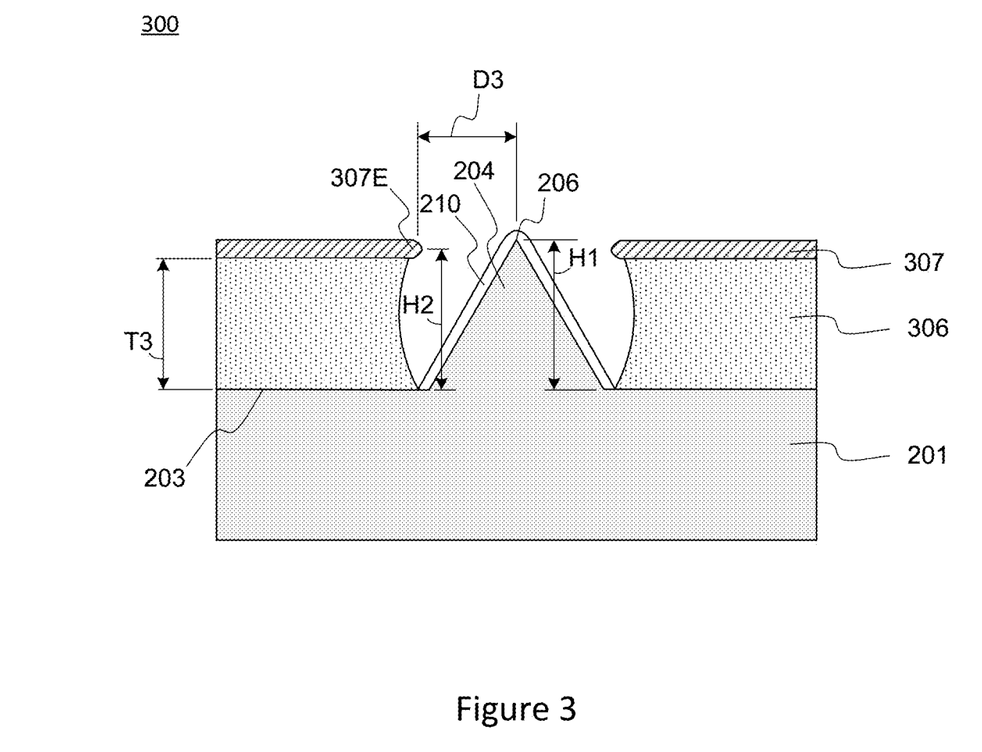
FIG. 3 is a cross-sectional side view illustrating an electron gun in a triode configuration including a SiC-coated silicon field emitter protrusion formed on a silicon substrate and a gate layer according to an alternative embodiment of the present disclosure.

FIG. 3 illustrates, in cross section view, an electron gun 300 according to a first alternative embodiment. Similar to the structure described above in FIG. 2, electron gun 300 includes a field emitter cathode formed by a field emitter protrusion 204 integrally connected to a silicon substrate 201 and extending upward form output surface 203. Electron gun 300 differs from the previously described embodiments in that it includes a gate 307, or control electrode, that disposed on one or more dielectric layers 306 such that an inside edge 307E of conductive gate 307 is spaced from tip portion 206 of field emitter protrusion 204 by a predetermined distance D3. In order to achieve fast and accurate control of the emission current, a thickness T3 of dielectric layer 306 is controlled such that a height H2 of gate 307 is similar to height H1 of field emitter tip portion 206 (i.e., measured relative to output surface 203 located outside the periphery of field emitter protrusion 204). Thus, a thickness T3 of the dielectric layer 306 is approximately equal to or less than height H1 of field emitter protrusion 204. Preferably, thickness T3 of dielectric layer 306 differs from height H1 of field emitter protrusion 204 by no more than a few hundred nm (e.g., such that height H2 is within a range of ±300 nm of height H1). For example, thickness T3 may be chosen so that gate 307 is at approximately the same height as, or about 200 nm higher than, or about 200 nm lower than field emitter tip portion 206. Dielectric layer 306 may comprise one or more dielectric materials, such as $SiO_2$ or $Si_3N_4$. The dielectric layer 306 is disposed on the top surface of the silicon surrounding field emitter protrusion 204 but does not necessarily cover field emitter protrusion 204. In another instance, the dielectric layer 306 partly covers the field emitter. Gate 307 and dielectric layer 306 can be fabricated by standard CMOS fabrication techniques such as using PVD, CVD, or ALD deposition methods. The gate 307 may comprise a metal or polysilicon. The simplest emitter design is the triode configuration in which only one gate 307 is used, but other configurations are possible. This gate 307 is typically formed on top of dielectric layer 306, comprising one or several insulating layers, deposited on the substrate 201. Two or more gate layers (not shown) may be utilized in more complex emitter designs, where multiple dielectric layers are used as spacers in between these gate layers. Note that electron gun 300 is not limited to pyramidal or conical field emitters and may comprise any shape field emitter, such as a rounded whisker shaped field emitter or another shape. Changes or configurations different from those in FIG. 2 are possible in the embodiment of FIG. 3.

While SiC layer 210 is illustrated as only covering field emitter protrusion 204 in FIG. 3, SiC layer 205 also can extend under dielectric layer 306. For example, SiC layer 210 may be formed on output surface 203 of substrate 201 and over field emitter protrusion 204 before the formation of dielectric layer 306.

Figure 4A:
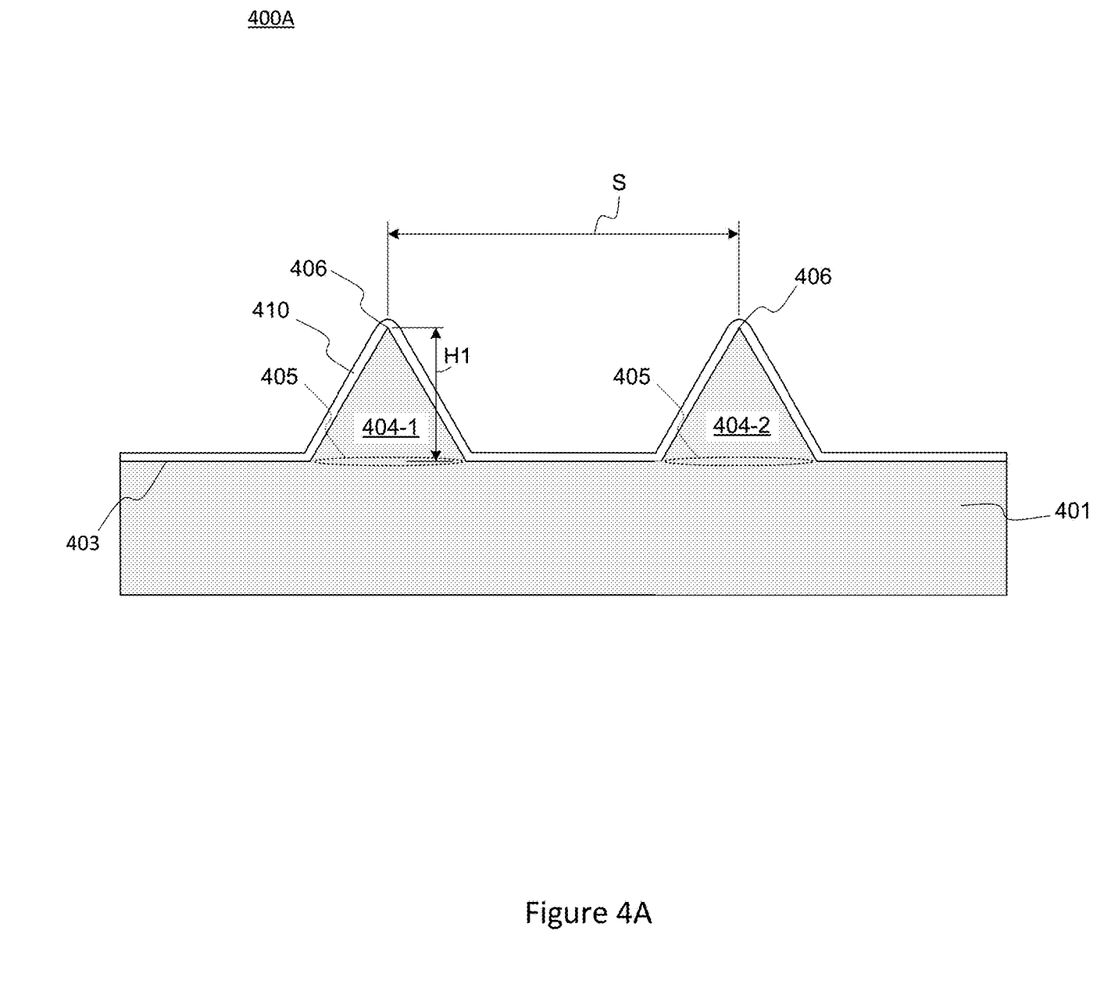
FIG. 4A and FIG. 4B are cross-sectional side view diagrams illustrating multi-electron-beam electron guns including SiC-coated silicon field emitter protrusion arrays formed on silicon substrates in diode and triode configurations according to alternative embodiments of the present disclosure.
Figure 4B:
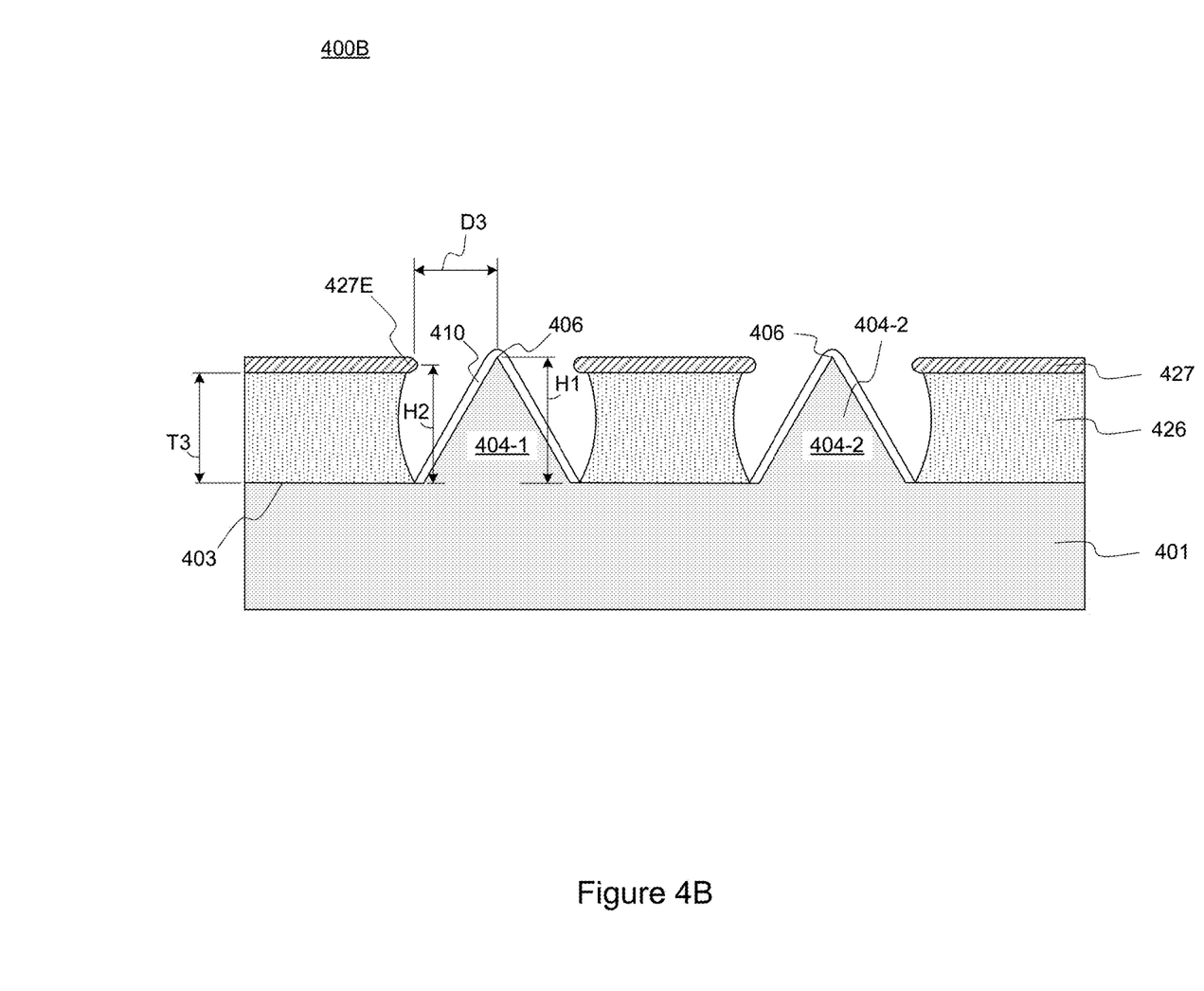

FIGS. 4A and 4B illustrate, in cross section views, disclosed electron guns according to other alternative embodiments of the present disclosure in which additional layers and structures are utilized to further enhance the beneficial qualities of the disclosed electron gun structure. The illustrated exemplary embodiments are not intended to be exhaustive, and electron guns including combinations of the additional layers and structures described below are understood to be possible. The embodiments of FIGS. 4A and 4B may be similar to the embodiments of FIGS. 2 and 3 arranged in an array. Thus, SiC layer 410 may be similar to SiC layer 210 (described above). Note that electron guns 400A and 400B are not limited to pyramidal or conical field emitter protrusions may comprise any shape field emitter protrusion, such as a rounded whisker shaped field emitter or another shape. Changes from, or configurations other than, those shown in FIGS. 2 and 3 are possible in the embodiments of FIGS. 4A and 4B.

FIG. 4A illustrates, in a cross section view, an electron gun 400A according to a second alternative embodiment. Electron gun 400A includes a field emitter array (FEA) cathode formed on silicon substrate 401 and an anode (not shown) facing the FEA cathode. Silicon substrate 401 has an upward-facing output (top) surface 403 with a plurality of field emitter protrusions 404-1 and 404-2 arranged in a two-dimensional periodic pattern and a contiguous SiC layer 405 disposed on the output surface 403 covering field emitter protrusions 404-1 and 404-2. Field emitter protrusions 404-1 and 404-2 have a pyramidal shape that can be made by anisotropic etching, whereby each protrusion 404-1 and 404-2 has a base portion 405 generally aligned output surface 403 and a tip portion 406. In a manner similar to the field emitter 204 described above, field emitters 404-1 and 404-2 can be fabricated by standard CMOS fabrication techniques. Oxidation sharpening, which may be performed at a low to moderate temperature (less than about 950° C.), may be used prior to forming SiC layer 410 when sharp field emitter tip portions 406 are desired. A second electrode (i.e. an anode, not shown) is positioned facing the field emitter cathode. The anode may be made of metals such as tungsten, molybdenum, and stainless steel among others. A voltage source is utilized to generate an external potential difference between the FEA cathode and the anode in order to cause electrons to preferentially move toward emitter tip portions 406. Electron gun 400A operates similarly to a typical cold electron gun in that, when positioned properly, electrons have a high probability of being emitted, from substrate 401 through the output surface 403 of the FEA, most often from near the tip portions 406 of the field emitter protrusions 404-1 and 404-2.

A parameter influencing the field emitter properties in an FEA cathode is a spacing S between adjacent field emitters 404-1 and 404-2. Closely-spaced emitters reduce the field enhancement factor due to screening effects resulting in insufficient electric field penetration into the individual emitters. Hence, to minimize field-shielding effects and to optimize field emission current density, the distance between vertically aligned emitter protrusions 404-1 and 404-2, or the emitter spacing S, can be substantially large, such as on the order of tens of microns to even centimeters. In an instance, the field emitters are spaced from 100 μm to 10 cm apart, including all ranges and values to the 1 μm therebetween. For example, the field emitters may be spaced 10 μm, 50 μm, 100 μm, 200 μm, or 500 μm apart. The spacing of the emitters may be at least 3 times nominal height H1 of emitter protrusions 404-1 and 404-2. Generally, the spacing of the emitters matches the electron optics of the system that they are incorporated into. For that reason, a spacing between 100 μm and several cm might be chosen.

FIG. 4B illustrates, in a cross-section view, an electron gun 400B according to a third alternative embodiment. Similar to the structure described above, electron gun 400B includes a field emitter array (FEA) cathode formed on a silicon substrate 401 having an upward-facing output (top) surface 403 with a plurality of field emitter protrusions 404-1 and 404-2 arranged in a two-dimensional periodic pattern, and a contiguous SiC layer 405 disposed on the output surface 403 at least over tip portions 406 of protrusions 404-1 and 404-2. Electron gun 400B differs from electron gun 400A in that it includes a gate 427 (or control electrode) disposed at a height H2 that is similar to nominal height H1 of field emitter protrusions 404-1 and 404-2 tips and attached to substrate 401 by a dielectric 426. Gate 427 allows fast and accurate control of the emission current. The dielectric layer 426 is disposed on the top surface of the silicon surrounding field emitter protrusions 404-1 and 404-2, but does not cover any portion of protrusions 404-1 and 404-2. In another instance, the dielectric layer 426 partly covers one or more of the field emitter protrusions 404-1 and 404-2. The gate 427 or dielectric layer 426 can be fabricated by standard CMOS fabrication techniques such as using PVD, CVD, or ALD deposition methods. The gate 427 may comprise a metal or polysilicon. The simplest emitter design is the triode configuration in which only one gate layer is used, but other configurations are possible. This gate 427 is typically formed on top of an insulating layer (dielectric 426), which is usually an oxide layer, deposited on the substrate. Two or more gate layers are utilized in more complex emitter designs (not shown), where insulating layers form spacers in between these gate layers. Inside edges 427E of gates 427 are respectively spaced from tip portions 406 of field emitter protrusions 404-1 and 404-2 by a predetermined distance D3.

Field emission from silicon field emitters can be described by the well-known Fowler-Nordheim tunneling. The local field at an emitter tip is enhanced by a field enhancement factor compared with the applied electric field. As the external electric field penetrates into the semiconductor, the carrier concentration in the near-surface region changes.

For a high electrostatic bias field such as $10^7$ V cm$^{-1}$, the conduction band of a p-type field emitter will be degenerate at the surface, and a depletion region, in which the Fermi level lies in the middle of the energy gap, will be created between the p-type interior and the n-type surface. This leads to a minimum concentration of electrons and holes in such region, similar to the case of a reverse-biased p-n junction.

When the cathode comprises n-type silicon, or when a cathode comprising p-type silicon is operated as a photocathode, the applied electrostatic field need only be strong enough to bend the conduction and valence bands down at the tip, but does not need to bend the conduction band below the Fermi level. With such an applied electrostatic field, few electrons will be generated spontaneously and most of the emission current will come from electrons injected into the region near the tip from the n-type silicon or from electron-hole pairs created by absorption of light.

In previous silicon field emitters, there would be, at least, a thin oxide layer on the silicon surface. This oxide, even if only about 2 nm thick, represents a substantial barrier to any electrons trying to escape. The band gap of silicon dioxide is approximately 9 eV. Such a large band gap results in a local peak in the conduction band within the oxide that is several eVs higher than the conduction band within the silicon. The SiC layer on the disclosed field emitter surface blocks oxygen or water from reaching the silicon surface and prevents growth of an oxide layer, thus enabling an efficient electron gun.

In one embodiment this silicon field emitter is operated at a temperature close to room temperature to minimize the energy spread of the emitted electrons. In another embodiment, useful when a larger energy spread can be tolerated, the silicon field emitter is operated at an elevated temperature, such as a temperature between about 400K and about 1000K, in order to reduce contamination adhering to the surface of the field emitter and allow operation of the silicon field emitter in a less clean vacuum environment.

Various modifications to the described embodiments will be apparent to those with skill in the art, and the general principles defined herein may be applied to other embodiments. For example, additional electrodes may be placed close to the electron emitter to control the emission, and/or to focus and direct the emitted electrons in a specific direction. Although it is expected that that the electron guns comprising silicon field emitters disclosed herein will be particularly useful in various kinds of scanning electron microscopes and electron-beam lithography systems, it is also envisioned that these electron guns may be useful in other applications where high radiance and/or high current electron beams are required.

The electron guns and fabrication methods described herein are not intended to be limited to the particular embodiments shown and described, but are to be accorded the widest scope consistent with the principles and novel features herein disclosed.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An electron gun including a field emitter configured to generate a primary electron beam, wherein the field emitter comprises:
   a monocrystalline silicon substrate having opposing first and second surfaces and including at least one integral field emitter protrusion, said field emitter protrusion having a fixed portion integrally connected to the silicon substrate and extending from said second surface to a tip portion,
   a silicon carbide (SiC) layer hermetically disposed at least on said tip portion the field emitter protrusion such that, during operation, electrons that leave said monocrystalline silicon substrate through said tip portion to form said primary electron beam only pass through said SiC layer,
   wherein said SiC layer comprises at least 75% SiC, and
   wherein a portion of the SiC layer located within a radius of 100 nm from said tip portion comprises less than 10 atomic percent oxygen.

2. The electron gun of claim 1, wherein the monocrystalline silicon substrate is p-type doped with a doping level less than about $10^{19}$ cm$^{-3}$.

3. The electron gun of claim 1, wherein the SiC layer comprises greater than 90 atomic percent SiC.

4. The electron gun of claim 1, wherein the monocrystalline silicon substrate is n-type doped with a doping level between about $10^{15}$ cm$^{-3}$ and about $10^{19}$ cm$^{-3}$.

5. The electron gun of claim 1, wherein the SiC layer has a thickness in the range of 1 nm to 10 nm.

6. The electron gun of claim 1,
   wherein the field emitter field emitter protrusion comprises one of a cone, a pyramid and a rounded whisker; and
   wherein the tip portion of the field emitter protrusion has a lateral dimension of less than 50 nm.

7. The electron gun of claim 6, wherein the tip portion of the field emitter protrusion has a lateral dimension greater than 5 nm.

8. The electron gun of claim 1,
   wherein the field emitter protrusion comprises one of a cone, a pyramid and a rounded whisker; and
   wherein the tip portion of the field emitter protrusion has a diameter less than 50 nm.

9. The electron gun of claim 1, wherein the field emitter is configured to operate in a reverse bias mode in which a depletion layer is generated adjacent to the second surface in response to an applied electric field.

10. The electron gun of claim 1, wherein the field emitter further comprises:
    a dielectric layer disposed on the second surface of the monocrystalline silicon substrate adjacent to the field emitter protrusion; and
    a conductive gate disposed on the dielectric layer such that an edge of the conductive gate is spaced from the tip portion of the field emitter protrusion by a predetermined distance,
    wherein the thickness of the dielectric layer is within a range of ±300 nm of a height of the field emitter protrusion.

11. The electron gun of claim 1, further comprising a plurality of said field emitter protrusions arranged in a two-dimensional periodic pattern, each said field emitter protrusion having an associated said fixed portion integrally connected to the silicon substrate and extending from said second surface to a tip portion, wherein said SiC layer is hermetically disposed at least on said tip portion of each of said plurality of field emitter protrusions.

12. The electron gun of claim 11, wherein the field emitter further comprises:
    a dielectric layer disposed on the second surface of the monocrystalline silicon substrate adjacent to the plurality of said field emitter protrusions; and
    a conductive gate disposed on the dielectric layer such that edges of the conductive gate are spaced from the tip portion of each of the plurality of field emitter protrusions by a predetermined distance,
    wherein the thickness of the dielectric layer is within a range of ±200 nm of a nominal height of the plurality of field emitter protrusions.

13. A scanning electron microscope (SEM) comprising:
    an electron gun including a field emitter configured to generate a primary electron beam;
    electron optics configured to de-magnify and focus the primary electron beam onto a sample; and
    a detector configured to detect at least one of backscattered electrons and secondary electrons transmitted from the sample in response to the primary electron beam,
    wherein the field emitter comprises:
    a monocrystalline silicon substrate having opposing first and second surfaces and including at least one integral field emitter protrusion, said field emitter protrusion having a fixed portion integrally connected to the silicon substrate and extending from said second surface to a tip portion,
    a silicon carbide (SiC) layer hermetically disposed at least on said tip portion the field emitter protrusion such that, during operation, electrons that leave said monocrystalline silicon substrate through said tip portion to form said primary electron beam only pass through said SiC layer,
wherein said SiC layer comprises at least 75% SiC, and wherein a portion of the SiC layer located within a radius of 100 nm from said tip portion comprises less than 10 atomic percent oxygen.

14. A device including an electron gun, the electron gun including a field emitter configured to generate a primary electron beam, wherein the field emitter comprises:
a monocrystalline silicon substrate having opposing first and second surfaces and including at least one integral field emitter protrusion, said field emitter protrusion having a fixed portion integrally connected to the silicon substrate and extending from said second surface to a tip portion; and
a silicon carbide (SiC) layer hermetically disposed at least on said tip portion the field emitter protrusion such that, during operation, electrons that leave said monocrystalline silicon substrate through said tip portion to form said primary electron beam only pass through said SiC layer,
wherein said SiC layer comprises at least 75% SiC, and wherein a portion of the SiC layer located within a radius of 100 nm from said tip portion comprises less than 10 atomic percent oxygen.

15. The device of claim 14, wherein the device comprises one of a scanning electron microscope (SEM) system and an electron-beam lithography system.

16. An electron gun including a field emitter configured to generate a primary electron beam, wherein the field emitter comprises:
a monocrystalline silicon substrate having opposing first and second surfaces and including at least one integral field emitter protrusion, said field emitter protrusion having a fixed portion integrally connected to the silicon substrate and extending from said second surface to a tip portion;

a silicon carbide (SiC) layer hermetically disposed at least on said tip portion the field emitter protrusion such that, during operation, electrons that leave said monocrystalline silicon substrate through said tip portion to form said primary electron beam only pass through said SiC layer, wherein said SiC layer comprises at least 75% SiC; and
means for maintaining the field emitter at a vacuum level of less than about $10^{-10}$ Torr during operation.

17. An electron gun including a field emitter configured to generate a primary electron beam, wherein the field emitter comprises:
a monocrystalline silicon substrate having opposing first and second surfaces and including at least one integral field emitter protrusion, said field emitter protrusion having a fixed portion integrally connected to the silicon substrate and extending from said second surface to a tip portion; and
a silicon carbide (SiC) layer hermetically disposed at least on said tip portion the field emitter protrusion such that, during operation, electrons that leave said monocrystalline silicon substrate through said tip portion to form said primary electron beam only pass through said SiC layer,
wherein said SiC layer comprises at least 75% SiC, and wherein the monocrystalline silicon substrate has a thickness greater than about 10 μm and is p-type doped with a doping level less than about $10^{14}$ cm$^{-3}$.

18. The electron gun of claim 17, further comprising a light source configured to illuminate the first surface of the monocrystalline silicon substrate, wherein the light source comprises one of a laser diode and a light emitting diode configured such that an emission current of the primary electron beam is controllable in proportion to an amount of light transmitted from said light source into said monocrystalline silicon substrate.

* * * * *